(12) United States Patent
Lytle (10) Patent No.: US 12,374,891 B2
(45) Date of Patent: Jul. 29, 2025

(54) SYSTEM, CONTROLLER, AND METHOD FOR PREDICTIVE CONTROL OF ENERGY MANAGEMENT FOR A SEGMENTED LOAD CENTRE

(71) Applicant: SPONGE MICROGRIDS INC., Toronto (CA)

(72) Inventor: Jeremy Douglas Lytle, Toronto (CA)

(73) Assignee: SPONGE MICROGRIDS INC., Toronto (CA)

( * ) Notice: Subject to any disclaimer, the term of this patent is extended or adjusted under 35 U.S.C. 154(b) by 400 days.

(21) Appl. No.: 18/173,395

(22) Filed: Feb. 23, 2023

(65) Prior Publication Data

US 2023/0275438 A1 Aug. 31, 2023

Related U.S. Application Data

(60) Provisional application No. 63/313,908, filed on Feb. 25, 2022.

(51) Int. Cl.
*H02J 3/32* (2006.01)
*G06F 30/27* (2020.01)
(Continued)

(52) U.S. Cl.
CPC .............. *H02J 3/32* (2013.01); *G06F 30/27* (2020.01); *H02J 3/003* (2020.01); *H02J 3/004* (2020.01);
(Continued)

(58) Field of Classification Search
CPC .... H02J 3/32; H02J 3/003; H02J 3/004; H02J 3/381; H02J 7/00712; H02J 2203/10;
(Continued)

(56) References Cited

U.S. PATENT DOCUMENTS 8,862,279 B2 10/2014 Darden et al.
9,148,016 B2 9/2015 Kaufman et al.
(Continued)

FOREIGN PATENT DOCUMENTS

CN 202696194 U 1/2013
EP 2846436 B1 12/2016

OTHER PUBLICATIONS

"48V solar inverter charger", Renogy, https://ca.renogy.com/48v-3500w-inverter-charger/ (Archived at: https://web.archive.org/web/20211219024459/https://ca.renogy.com/48v-3500w-inverter-charger/ , archive date: Dec. 19, 2021).
(Continued)

*Primary Examiner* — Ziaul Karim
(74) *Attorney, Agent, or Firm* — Bhole IP Law; Anil Bhole; Chris Dynowski (57) ABSTRACT

A system, controller, and method for predictive control of energy management for a segmented load centre. The method including: determining a load prediction for a predetermined prediction timeframe, the load prediction using a machine learning model taking load conditions of the power flow data as input features, the machine learning model trained using historical load conditions; determining a generation prediction for the predetermined prediction timeframe using a renewable generation model, the generation prediction using input features including solar radiation related weather data; determining an energy balance over the prediction timeframe using the load prediction and the generation prediction; modulating a minimum state of charge setpoint based on whether a current value of the setpoint results in curtailed generation in the determined energy balance over the prediction timeframe.

21 Claims, 7 Drawing Sheets

(51) Int. Cl.
*H02J 3/00* (2006.01)
*H02J 3/38* (2006.01)
*H02J 7/00* (2006.01)

(52) U.S. Cl.
CPC .......... *H02J 3/381* (2013.01); *H02J 7/00712* (2020.01); *H02J 2203/10* (2020.01); *H02J 2203/20* (2020.01); *H02J 2300/24* (2020.01); *H02J 2300/28* (2020.01)

(58) Field of Classification Search
CPC ............... H02J 2203/20; H02J 2300/24; H02J 2300/28; H02J 2300/20; H02J 3/466; G06F 30/27
See application file for complete search history.

(56) References Cited

U.S. PATENT DOCUMENTS

| | | | | |
|---|---|---|---|---|
| 9,600,045 | B2 | 3/2017 | Sanders | |
| 10,489,731 | B2* | 11/2019 | Fife | H02J 3/28 |
| 10,833,508 | B2* | 11/2020 | Wang | G06F 1/3209 |
| 2014/0035372 | A1* | 2/2014 | Normoyle | H01H 3/00 |
| | | | | 335/172 |
| 2014/0172503 | A1* | 6/2014 | Hammerstrom | G05B 15/02 |
| | | | | 705/7.31 |
| 2016/0061610 | A1* | 3/2016 | Meyer | B60L 58/12 |
| | | | | 701/22 |
| 2017/0317528 | A1* | 11/2017 | Fife | H02J 3/003 |
| 2018/0314220 | A1* | 11/2018 | Kumar | G05B 19/042 |
| 2019/0079473 | A1* | 3/2019 | Kumar | G05B 13/048 |
| 2020/0185922 | A1* | 6/2020 | Hinterberger | B60L 53/53 |

OTHER PUBLICATIONS

"Energy Hub", Ferroamp (Sweden), https://ferroamp.com/produkter/energilager/ (Archived at: https://web.archive.org/web/20220123111903/https://ferroamp.com/produkter/energilager/ , archive date: Jan. 23, 2022).

"Islanding Inverter", Pika Energy, https://www.pika-energy.com/islanding-inverter/ (Archived at: https://web.archive.org/web/20211027121921/https://www.pika-energy.com/islanding-inverter/ , archive date: Oct. 27, 2021).

"Radian series inverter/charger", Outback Power, https://www.outbackpower.com/products/inverter-chargers/radian-series (Archived at: https://web.archive.org/web/20211206233440/https://www.outbackpower.com/products/inverter-chargers/radian-series , archive date: date: Dec. 6, 2021).

Salom, Jaume , et al., "Advanced concepts for renewable energy supply of data centres", 2017, pp. 93, 144, https://www.riverpublishers.com/pdf/ebook/RP_9788793519411.pdf.

Wang, Yahui , et al., "Hybrid AC/DC microgrid architecture with comprehensive control strategy for energy management of smart building", 2018, https://www.sciencedirect.com/science/article/abs/pii/S0142061517326510.

* cited by examiner

SYSTEM, CONTROLLER, AND METHOD FOR PREDICTIVE CONTROL OF ENERGY MANAGEMENT FOR A SEGMENTED LOAD CENTRE

TECHNICAL FIELD

The following relates, generally, to renewable power generation and storage; and more particularly, to a system, controller, and method for predictive control of energy management for a segmented load centre.

BACKGROUND

Onsite renewables are an important component of the clean energy transition due their ability to offset demand growth, provide grid-level benefits and services, and provide energy resilience at the point of consumption. However, the typical integration approach, which involves a parallel connection of onsite generators to the utility electric service, means that deployment is substantially limited, and is ultimately limited in achievable penetration. These limitations arise from capacity constraints in existing distribution grid infrastructure (feeders, transformers, etc.), which limit acceptable exported power flows. Detailed engineering studies are often required to be performed by distribution utilities in order to reach these conclusions about existing capacity. Study timelines often create a bottleneck in the build out of new projects, slowing the pace of deployment and creating uncertainty which can disrupt project financing. Further, infrastructural upgrade costs, if required, may be pushed on to the project developer, often challenging the economics of the project. Integration of battery storage alone can solve elements of this problem by reducing the amount of export capacity required. However, when connected in a parallel manner the same bottlenecks can apply and, depending on how the battery is coupled to other generators, may further complicate grid studies.

Generally, integration of renewable energy sources in facilities which are grid-tied requires that the renewable generators are also grid-tied with a bidirectional interconnection interface. This approach can be used to maximize the economic benefit of a renewable generator due to the inherent variability in output. When local generation exceeds local load, excess generation may be exported elsewhere via the utility grid, such that every generated unit of energy provides value to the asset owner, and thus maximizing return-on-investment (ROI).

However, utility grids are generally designed for one-way power delivery. Changing this paradigm is unlikely to happen rapidly on a ubiquitous scale due to the complications and costs of maintaining existing aging infrastructure while also building in capacity for projected demand growth. Due to this dilemma, coupled with the fact that renewable generators behave differently than distributed load centres with regards to load diversity, grid-tied generation has inherent upper limits to penetration in current grid segments. Once a given distribution circuit reaches a unique threshold of renewable energy holding capacity, that circuit will be unable to accommodate additional renewable energy adoption via the grid-tied means of interconnection. In addition, electricity markets generally disincentivize energy exports at high penetrations of onsite renewables as feed-in tariffs shift towards wholesale, rather than retail prices, leading to a reduction is value per unit energy in the range of, for example, 60-80%.

SUMMARY

In an aspect, there is provided a method for predictive control of energy management for a segmented load centre, the method executable on a controller or executed as a model on a computing device, the method comprising: receiving power flow data from the segmented load centre; determining a load prediction for a predetermined prediction timeframe, the load prediction using a machine learning model taking load conditions of the power flow data as input features, the machine learning model trained using historical load conditions; determining a generation prediction for the predetermined prediction timeframe using a renewable generation model, the generation prediction using input features comprising weather data related to the generation of renewable power; determining an energy balance over the prediction timeframe using the load prediction and the generation prediction; modulating a minimum state of charge setpoint based on whether a current value of the setpoint results in curtailed generation in the determined energy balance over the prediction timeframe; and outputting the minimum state of charge setpoint.

In a particular case of the method, modulating the minimum state of charge setpoint comprises iterating the modulation until an end condition is reached.

In another case of the method, the method further comprising, where the minimum state of charge setpoint reaches a predetermined minimum threshold before the end condition, modulating a diversion load schedule, repeating the operation simulation of the load centre, and outputting the diversion load schedule.

In yet another case of the method, the method further comprising, where the minimum state of charge setpoint reaches a predetermined maximum threshold, iteratively performing a simulation of outage performance for time periods within the prediction timeframe.

In yet another case of the method, the method further comprising, where an outage results in lost load before a predetermined minimum outage duration threshold, increasing the minimum state of charge setpoint and repeating the simulation of outage performance until an outage end condition is reached.

In yet another case of the method, the weather data comprises time series forecast for one or more of dry bulb temperature, global horizontal irradiation, direct normal irradiation, wind speed, wind direction, and precipitation.

In yet another case of the method, the renewable generation model further takes as input installation features or internal system features of a photovoltaic array or wind turbine array.

In yet another case of the method, the load prediction comprises predictions for asynchronous load over the prediction timeframe and diversion load over the prediction timeframe In yet another case of the method, the load conditions comprise loads during certain weather conditions, and loads during certain times of the day, days of the week, or times of the year.

In yet another case of the method, determining the energy balance over the prediction timeframe comprises simulating operation of the load centre to determine the energy balance for the prediction timeframe.

In yet another case of the method, the simulation comprises: determining a net load by subtracting effective generation from a current load; and determining energy storage capacity by: where the net load is positive, subtracting the determined net load from the energy storage capacity; or where the net load is negative, charging the energy storage in proportion to the net load or a total remaining capacity the energy storage.

In another aspect, there is provided a controller for predictive control of energy management for a segmented load centre, the controller comprising one or more processing units in communication with a memory unit to: receive power flow data from the segmented load centre; determine a load prediction for a predetermined prediction timeframe, the load prediction using a machine learning model taking load conditions of the power flow data as input features, the machine learning model trained using historical load conditions; determine a generation prediction for the predetermined prediction timeframe using a renewable generation model, the generation prediction using input features comprising weather data related to the generation of renewable power; determine an energy balance over the prediction timeframe using the load prediction and the generation prediction; modulate a minimum state of charge setpoint based on whether a current value of the setpoint results in curtailed generation in the determined energy balance over the prediction timeframe; and output the minimum state of charge setpoint.

In a particular case of the controller, modulating the minimum state of charge setpoint comprises iterating the modulation until an end condition is reached.

In another case of the controller, where the minimum state of charge setpoint reaches a predetermined minimum threshold before the end condition, the controller further modulates a diversion load schedule, repeating the operation simulation of the load centre, and outputting the diversion load schedule.

In yet another case of the controller, where the minimum state of charge setpoint reaches a predetermined maximum threshold, the controller further iteratively performs a simulation of outage performance for time periods within the prediction timeframe.

In yet another case of the controller, where an outage results in lost load before a predetermined minimum outage duration threshold, the controller further increases the minimum state of charge setpoint and repeating the simulation of outage performance until an outage end condition is reached.

In yet another case of the controller, the weather data comprises time series forecast for one or more of dry bulb temperature, global horizontal irradiation, direct normal irradiation, wind speed, wind direction, and precipitation.

In yet another case of the controller, the renewable generation model further takes as input installation features or internal system features of a photovoltaic array or wind turbine array.

In yet another case of the controller, the load prediction comprises predictions for asynchronous load over the prediction timeframe and diversion load over the prediction timeframe.

In yet another case of the controller, the load conditions comprise loads during certain weather conditions, and loads during certain times of the day, days of the week, or times of the year.

In yet another case of the controller, determining the energy balance over the prediction timeframe comprises simulating operation of the load centre to determine the energy balance for the prediction timeframe.

In yet another case of the controller, the simulation comprises: determining a net load by subtracting effective generation from a current load; and determining energy storage capacity by: where the net load is positive, subtracting the determined net load from the energy storage capacity; or where the net load is negative, charging the energy storage in proportion to the net load or a total remaining capacity the energy storage.

In another aspect, there is provided a system for predictive control of energy management for a segmented load centre, the system comprising the controller in communication with one or more relays, an inverter, a distribution panel, a battery energy storage system and one or more converters or rectifiers.

These and other aspects are contemplated and described herein. It will be appreciated that the foregoing summary sets out representative aspects of the system, controller and method to assist skilled readers in understanding the following detailed description.

DESCRIPTION OF THE DRAWINGS

A greater understanding of the embodiments will be had with reference to the Figures, in which.

DETAILED DESCRIPTION

For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practised without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender. Further definitions for terms may be set out herein; these may apply to prior and subsequent instances of those terms, as will be understood from a reading of the present description.

Any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Further, unless the context clearly indicates otherwise, any processor or controller set out herein may be implemented as a singular processor or as a plurality of processors. The plurality of processors may be arrayed or distributed, and any processing function referred to herein may be carried out by one or by a plurality of processors, even though a single processor may be exemplified. Any method, application or module herein described may be implemented using computer readable/executable instructions that may be stored or otherwise held by such computer readable media and executed by the one or more processors.

The present inventors determined that there is a clear need for an integration solution which can enable broader penetration of onsite renewables by changing the paradigm of parallel connected generation and providing an energy management solution that enables efficient local consumption of renewably generated electricity. Such solution can eliminate constraints to both the scale and pace of deployment of onsite renewables and enable maximal value capture from the generating asset by offsetting high value retail prices rather than receiving lower export compensation.

Generally, to overcome the problem with grid-tied integration of renewable energy sources often involves export limiting controllers integrated into renewable systems; in order to curtail output in the event that generation exceeds the local load. In order to maximize resource utilization, these systems ideally also incorporate battery storage, such that excess generation may be absorbed by the battery, rather than curtailed. In addition to battery storage, some level of load flexibility may be sought via time shifting of certain intelligent loads.

However, the approach of using the above limitations is suboptimal for at least two reasons. Firstly, load flexibility via time-shifting of loads often leads to either an increase in overall energy consumption; for example, pre-cooling or pre-heating a building during unoccupied hours incurs losses beyond that of simply responding to the heating/cooling demand as needed because it is required to heat/cool past the occupant set-point and that additional energy cannot be perfectly stored). Load flexibility can also be a large inconvenience to the user; for example, based on solar generation, shifting water heater demand may cause water to be over- or under-heated for the user's needs at the time of need. Secondly, grid-interactive operation is inherently subject to the utility oversight and related bottlenecks to deployment. Utility requirements may cause system costs to escalate in support of feasibility studies, metering equipment replacement, and potential service upgrades to support generator integration; thus, raising the cost of entry beyond the reach of many interested consumers. Further, variable grid operating rules in different jurisdictions require private local generators to trip offline when a disturbance is experienced on the grid, after enduring unique fault ride-through duration windows. This means that grid level disturbances disrupt the operation of renewable generators, and an extraneous transfer switchgear is required to create isolation when disturbances arise.

Advantageously, in contrast to the above, the present embodiments enable the integration of renewables at distributed load centres (e.g., buildings), without relying on grid-interactive operation. In addition, to optimize performance, the present embodiments are able to maximize renewable energy utilization without having the grid as an infinite load; thus, providing competitive economics and lifecycle performance. The inability to effectively deliver on the latter point overcomes a substantial problem plaguing current solutions in the art. Embodiments of the present disclosure enable unlimited penetrations of non-interactive renewables in distribution systems, and deploys load flexibility; while maintaining traditional agent-based control for the devices in a building (for example, thermostat still controls furnace, water temp still controls water heater, occupant still controls dishwasher, and the like). The present embodiments can provide such advantages without requiring utility oversight, limitations, and cost adders.

The present embodiments are generally directed to the application of a non-grid-interactive building-level microgrid containing renewable generation and energy storage to a subset of a building's overall electric load. A system and method are provided to adjust a shape of a segmented load such that a maximum available resource may be utilized locally, while simultaneously maximizing potential energy resilience in the event of a grid outage. The present embodiments advantageously enable economic operation of a building integrated and variable renewable generator without access to a practically infinite load, such as the utility grid.

Embodiments of the present disclosure can use an integration architecture that segments a load centre into two subsets. The first subset remains connected to the utility grid; referred to as a "synchronous" subset. The second subset is segmented out and supported by an asynchronous microgrid; referred to as an "asynchronous" or "isolated" subset. The second subset of load is supported by a non-interactive, asynchronous inverter. Any grid power that may be brought in to serve the second subset load is converted into asynchronous power via double conversion across a DC (direct current) link. This arrangement advantageously ensures that injection of renewable power into the asynchronous load centre is entirely non-interactive with the utility supply, even if energy from the utility is required to supplement renewable sources in load support. Alternatively, grid power may be brought in directly via a transfer switch, which maintains mechanical isolation between the synchronous utility supply and asynchronous inverter.

In various embodiments, select circuits of the synchronous load subset can be routed through diversion switches, which can be programmed to toggle the power source for said loads between the utility grid and asynchronous microgrid sources. These diversion loads are utilized to provide flexibility to the microgrid load base to maximize resource utilization, without disrupting occupant preferences and optimal device energy routines.

Figure 1:
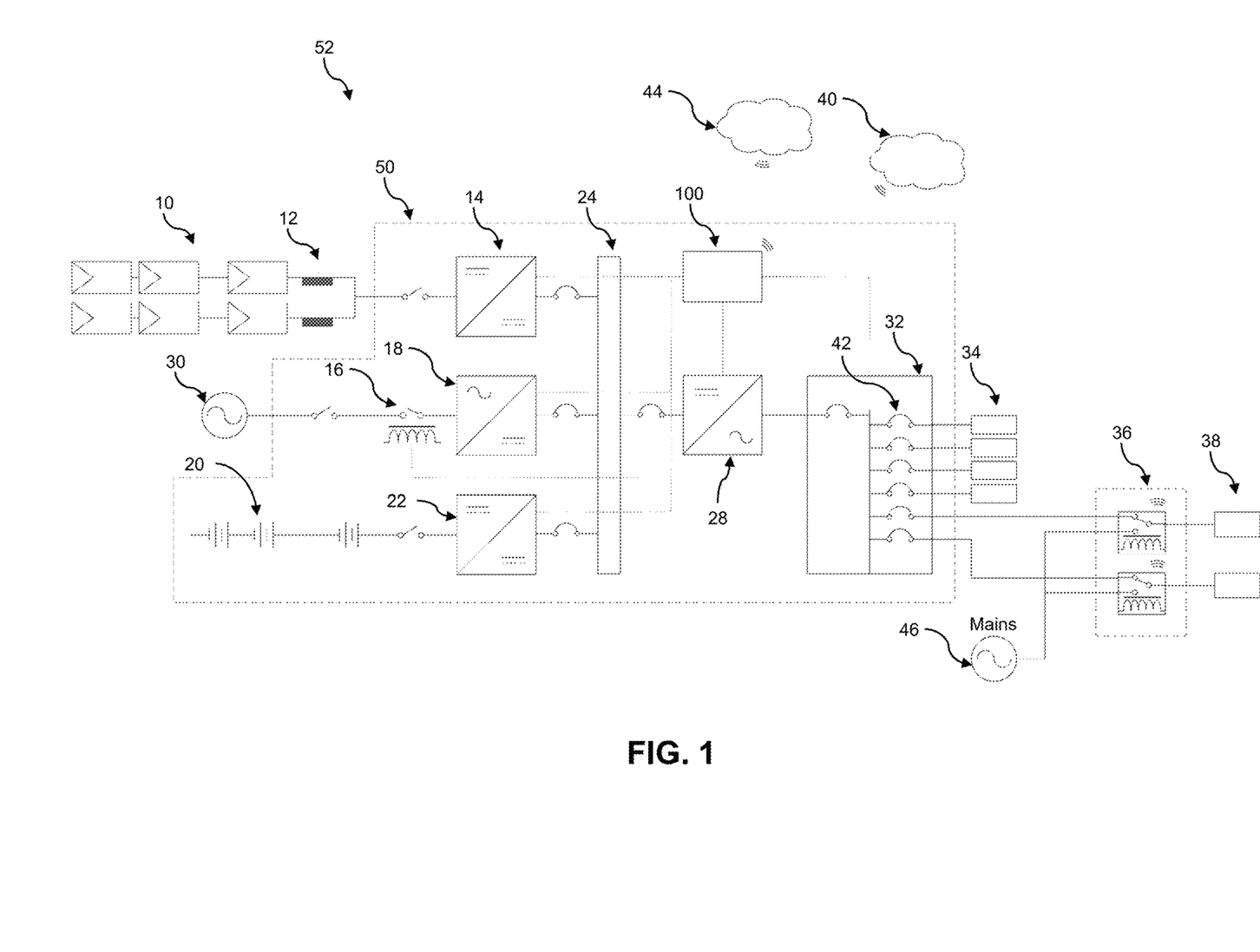
FIG. 1 is a conceptual diagram illustrating an example operating environment for a system for predictive control of energy management for a segmented load centre, in accordance with an embodiment.
Figure 7:
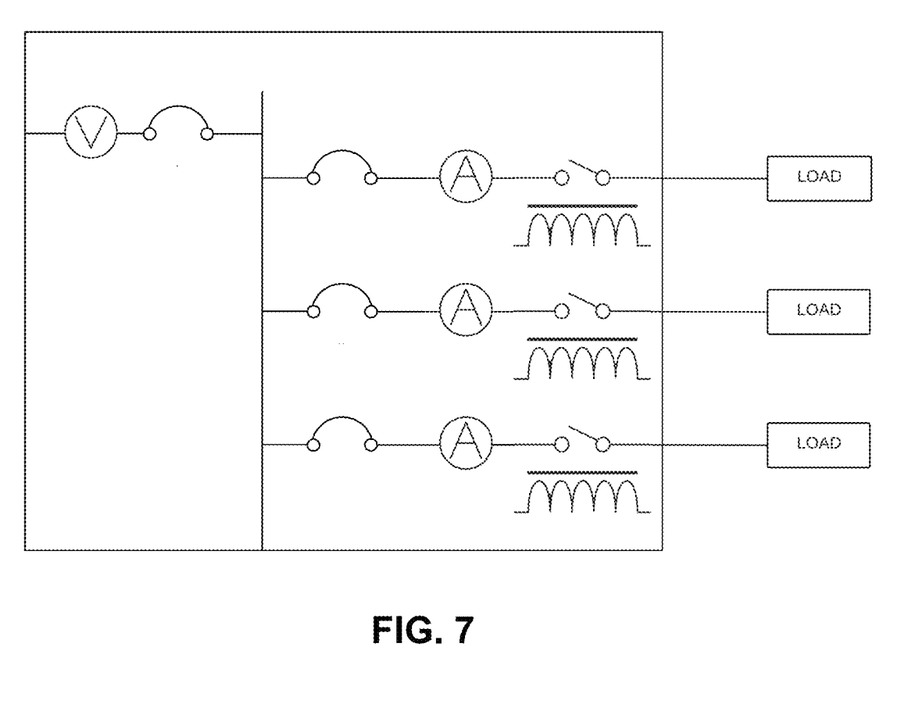
FIG. 7 illustrates a diagram of an example of a distribution panel, in accordance with the system of FIG. 2.

FIG. 1 illustrates an example operating environment 52 for a system 50 for predictive control of energy management for a segmented load centre, in accordance with embodiments described herein. The example environment includes an array of solar photovoltaic (PV) panels 10 connected to a rapid shutdown device 12, which is then connected to the system 50. In some cases, the distribution panel 32 includes, per load circuit, current sensing devices and controllable relays. In some cases, as part of the system 50, a DC-to-DC converter 14, with maximum power point tracking (MPPT) control, receives the output of the PV panels 10. A mains power supply 30 is connected to a mains power relay 16, which feeds a current controlled mains rectifier 18. The architecture 50 further includes a battery energy storage system (BESS) 20 connected to a DC-to-DC converter 22 for battery management. The converters 14 and 22, and the rectifier 18, are connected to a DC bus 24. The DC bus 24 is connected to a split-phase inverter 28. The split-phase inverter 28 is then connected to an alternating current (AC) distribution panel 32 that includes an array of breakers 42. In some cases, the distribution panel 32 includes, per load circuit, current sensing devices and controllable relays. FIG. 7 illustrates a diagram of an example of the distribution panel 32; however, any suitable arrangement can be used. A first subset of the relays 42 are each connected to permanently connected loads 34. A second subset of the relays 42 are each connected to controllable load diversion switches 36. Each of the controllable load diversion switches 36 are connected to a diversion load 38. Each diversion load 38 is a load to be switched from mains 46 for power utilization.

The system 50 includes an energy management controller 100 for predictive control of energy management for a segmented load centre, in accordance with an embodiment. In this case, the energy management controller 100 is in communication with the mains power relay 16, the DC-to-DC converters 14 and 22, the current controlled mains rectifier 18, the split-phase inverter 28, and the AC distribution panel 32 to control their operation. In some cases, the energy management controller 100 can be in communication with a weather forecast application programming interface (API) 40 and/or a cloud data storage/computing resources 44.

Figure 2:
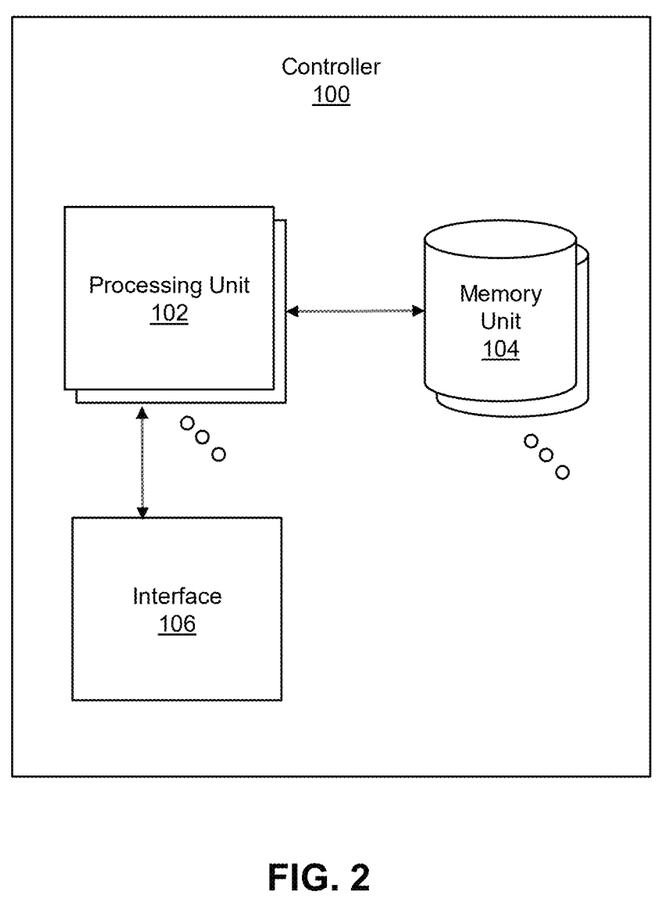
FIG. 2 is a conceptual diagram illustrating the system of FIG. 1.

Turning to FIG. 2, shown is a diagram for the controller 100 for energy management, in accordance with an embodiment. The controller 100 includes one or more processing units 102 in communication with one or more memory units 104 and an interface 106. Each memory unit 104 comprising a non-transitory computer-readable medium. The processing units 102 can comprise microprocessors, microcontrollers, dedicated hardware circuits, or the like. The processing unit 102 executes instructions stored on the one or more memory units 104 to perform a number of method steps, as described herein. The controller 100 may include other components as applicable or suitable, such as a local bus enabling the one or more processing units 102 to communicate with the one or more memory units 104 and the interface 106. The controller 100, via the interface 106, communicates with one or more of the mains power relay 16, the DC-to-DC converters 14 and 22, the current controlled mains rectifier 18, the split-phase inverter 28, and the AC distribution panel 32. In some cases, the controller 100, via the interface 106, can interface with the user, for example with a display and input device. In some cases, the controller 100 can also interface with other systems, via the interface 106, for example other computing devices and servers remotely located from the controller 100, such as the application programming interface (API) 40 and/or the cloud data storage/computing resources 44.

The energy management controller 100 operates to continuously determine optimal setpoints for the operation of the system 50, generally in accordance with a predictive modelling of future performance. This determination allows for maximizing the potential resilience of the system 50 in periods of limited resources, while also maximizing resource utilization during periods of surplus resources. In an embodiment, the energy management controller 100 determines and manages control variables: battery reserve capacity, or a minimum state of charge (SoC), and a diversion load schedule. The energy management controller 100 can utilize a model predictive control approach to optimize the setpoints of the two control variables to simultaneously achieve minimization of curtailment and maximization of resilience.

Figure 3:
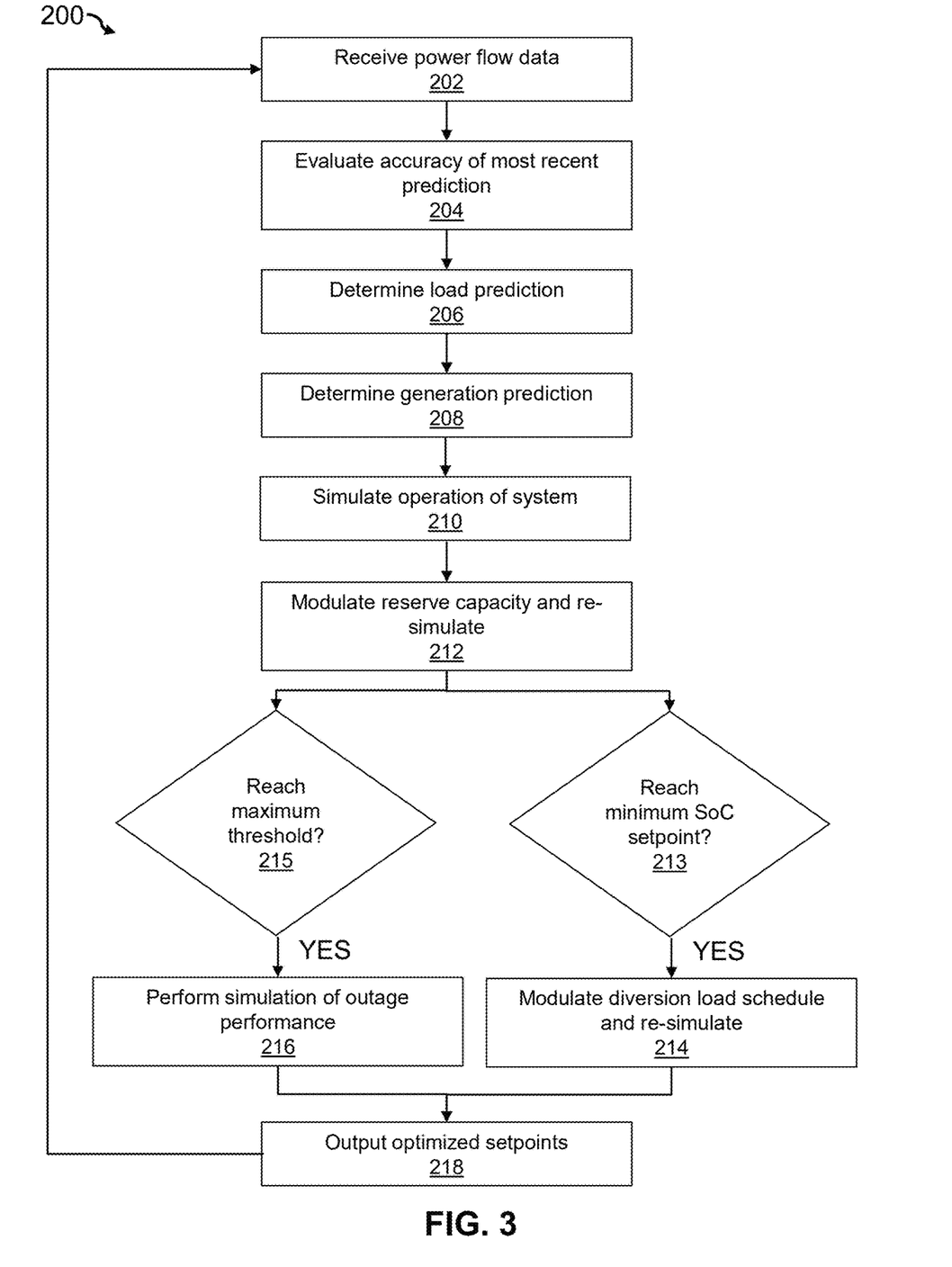
FIG. 3 is a flowchart illustrating a method for predictive control of energy management for a segmented load centre, in accordance with an embodiment.

During typical operation, the energy management controller 100 is either in a standby mode, in a mode where it logs power flow data averaged over a predefined sampling window, or in a mode where it responds to any active curtailment by actuating diversion loads. In accordance with an embodiment, the energy management controller 100 executes a method 200 for predictive control of energy management for a segmented load centre. Turning to FIG. 3, shown therein is a flowchart illustrating the method 200.

At block 202, the processing unit 102 receives power flow data, over a predefined sampling window, from one or more of the mains power relay 16, the DC-to-DC converters 14 and 22, the current controlled mains rectifier 18, the split-phase inverter 28, and the AC distribution panel 32. The received power flow data can be timestamped and received at any suitable interval/rate. The power flow data can encompass power flow data from various components of the segmented load centre; for example, solar converter power flow data (e.g., timestep, current power in watts), and return state and power flow data from other components (e.g., the battery). The power flow data can include, for example, timestep, current power in watts, state of charge, state of health, operating mode, conditional loads (such as load on components during certain weather conditions or during different times), and/or the like. The controller 100 can store this power flow data and integrate/combine it over time to determine total volume (or other applicable metrics) of energy provided and/or consumed by each node during a relevant time period.

At block 204, in some cases where there is a previous prediction, after the predefined sampling window has elapsed, the processing unit 102 evaluates the accuracy of a most recent prediction for the two control variables in order to determine the accuracy during the recently finished sampling window. Where there is no previous prediction, the processing unit 102 skips such evaluation. The predictions can include time series data sets of power supply and/or demand, as described herein. The accuracy determination can employ any suitable approach; for example, an error measurement technique such as mean absolute percentage error (MAPE) or root mean square deviation (RMSD) to evaluate error of the predicted data set with reference to a measured data set over the same interval. In some cases, the accuracy (i.e., error) can then be used to set a duration of the next supervisory interval (time until a next prediction/setpoint intervention). The mechanism correlating accuracy with supervisory interval can use any suitable approach, such as a look-up table function where low accuracy prescribes a shorter subsequent supervisory interval. In further cases, instead of performing accuracy evaluation or instead of using a constant supervisory interval, a control cost function can be applied to limit unnecessary control intervention in stable operating periods.

At block 206, the processing unit 102 determines a load prediction and, at block 208, determines a generation prediction. Both predictions can be for a predetermined prediction timeframe and can be performed concurrently or separately. In most cases, separate forecasts are generated for both the asynchronous loads and the diversion loads. The sampling window, and thus, the timeframe for the prediction can be any suitable length of time; for example, 24 hours, 48 hours, or the like. In some cases, the prediction timeframe can be longer than the sampling window, allowing the controller 100 to revise predictions based on input data received; for example, a 24-hour sampling window and a 48-hour prediction timeframe.

In most cases, determining the generation prediction, at block 208, can include using weather data related to the generation of renewable power. For example, receiving, such as over the Internet, a current weather forecast from a weather forecast API 40 and passing the weather data, with location and/or time of year, to a renewable generation model. Any suitable weather data related to the generation of renewable power can be used; for example, time series forecast for dry bulb temperature (deg C), global horizontal irradiation (GHI, W/m2), direct normal irradiation (DNI, W/m2), wind speed (m/s), wind direction (degrees) and precipitation (mm). In some cases, the weather forecast API can provide a full set of weather data per typical meteorological year (TMY) standards, rainfall, humidity, pressure, and the like. In further cases, instead of using a weather prediction, a seasonal average for the above weather related data can be used.

In most cases, the generation prediction model can be built to the corresponding system specifications. Using the renewable generation model, the processing unit 102 simulates the generation of renewable power over the prediction timeframe. In some cases, the generation data can be outputted at regular intervals; for example, at 10-minute timesteps.

In an example, where the renewable generation is provided by a PV array, the generation prediction model can use a 'pvlib' modelling library. In this example, a global location can be used to determine a time series profile of an angle of incidence (AOI) between the sun and PV panels for the prediction timeframe. Three components of a plane of array (POA) irradiance are individually determined at each model timestep; where the components include Direct, Reflected and Diffuse. Direct and Reflected are straightforward calculations, and Diffuse can use any suitable approach, such as a Perez transposition model. The components can be added together to arrive at a total POA irradiance at each timestep. Two different approaches can then follow. In a first approach, an equivalent circuit model can be used to determine the current and voltage response of the PV panels according to the POA irradiance and cell temperature at each timestep. In an alternate approach, the total POA irradiance is multiplied by the PV panel area and efficiency to arrive at an approximation of output power. Loss factors can be applied to the resultant power output (current×voltage) to account for, for example, reflections, panel soiling, and mismatch. The result is a time series data-set for PV panel output over the prediction timeframe, which represents the PV system generation over the prediction timeframe. This determination can be performed iteratively at each timestep within the prediction timeframe. In some cases, conditional elements can be factored in the prediction; for example, PV output is set to zero if the PV panel voltage is below a converter minimum voltage, and the like.

In some cases, the renewable generation model can take as input specific installation features of a photovoltaic (PV) array; for example, tilt angle, row azimuth (orientation) panel efficiency, temperature coefficients (which depend on mounting geometry), and the like.

In some cases, the renewable generation model can take as input specific installation features of a wind turbine array (such as a micro wind turbine array); for example, blade tilt angle/curvature, blade face orientation, turbine height above ground, blade length, and the like.

In some cases, the renewable generation model can take as input internal system features; for example, converter efficiencies, total battery capacity, battery efficiency, and the like.

In some cases, the renewable generation model can undergo automated periodic calibration to onsite measured data. For example, PV systems generally age over time, so the accuracy of the renewable generation model can be adjusted over time and factors can be adjusted in order to ensure the model remains accurate. In such example, every six months, the system 50 can use the most recent year's worth of measured PV output data and compare it to the predictions for that timeframe. The error of the predictions over that timeframe can be determined. The system 50 can then index various model parameters (for example, panel efficiency, soiling loss percentage, module resistance, and the like) and perform the prediction again to determine whether error can be reduced with the "recalibrated" model parameters.

In some cases, the renewable generation model can use a machine learning model to model an expected relationship between the weather data and expected power output. The renewable generation machine learning model output can be run at any suitable interval, for example, at an interval corresponding to the interval of the provided weather data. The machine learning model can be trained using a training dataset comprising prior known relationships between weather data and expected power output taking into account, for example, the input data described herein for the renewable power systems in the training dataset. In some cases, the input data can be represent the geometry and geographic location of the local renewable generation system, but such input data may not be required data points as active model inputs. The machine learning model may be periodically retrained, such that system aging and changing site conditions may be continually accounted for in the iterations of the model.

In some cases, determining the load predictions at block 206 can use machine learning models. These machine learning models can be trained with historical load conditions data that the system 50 collected over previous timeframes. The prediction for the electrical loads can use input data features from the received power flow data that include, for example, loads during certain weather conditions, and loads during different times of day, days of the week, and times of the year, and the like. In a particular case, the processing unit 102 can download a current weather forecast from the weather forecast API 40 and pass the input features to the machine learning model. The machine learning model uses the input features to estimate asynchronous load over prediction timeframe and diversion load over the prediction timeframe. In some cases, the estimates can be outputted at regular intervals; for example, at 10-minute timesteps. In some cases, the machine learning model can undergo automated re-training based on previously received data in order to continuously improve prediction accuracy as the characteristics evolve and change.

For load predictions, any suitable machine learning model can be used with a suitable balance of prediction accuracy and computational cost; for example, k-nearest neighbors (KNN) and Random Forest. In some cases, training data can include timestamped circuit-level power consumption data and timestamped historical weather data (for example, accessed via the weather data API). Some loads can be weather dependent, others can depend more generally on occupant patterns, and others can be more consistent.

In most cases, each measured circuit can reference its own unique model parameters (or feature characterization), which define how strongly the particular load is dependent on weather, time of day, season, and the like. This includes both the diversion loads and the asynchronous loads. In many cases, basic grid tied loads are not measured and not used in the prediction. Any suitable weather data can be incorporated as input; for example, outdoor air temperature. Other model features can include, for example, time, date, weekday; to take into account occupant use patterns.

Figure 4:
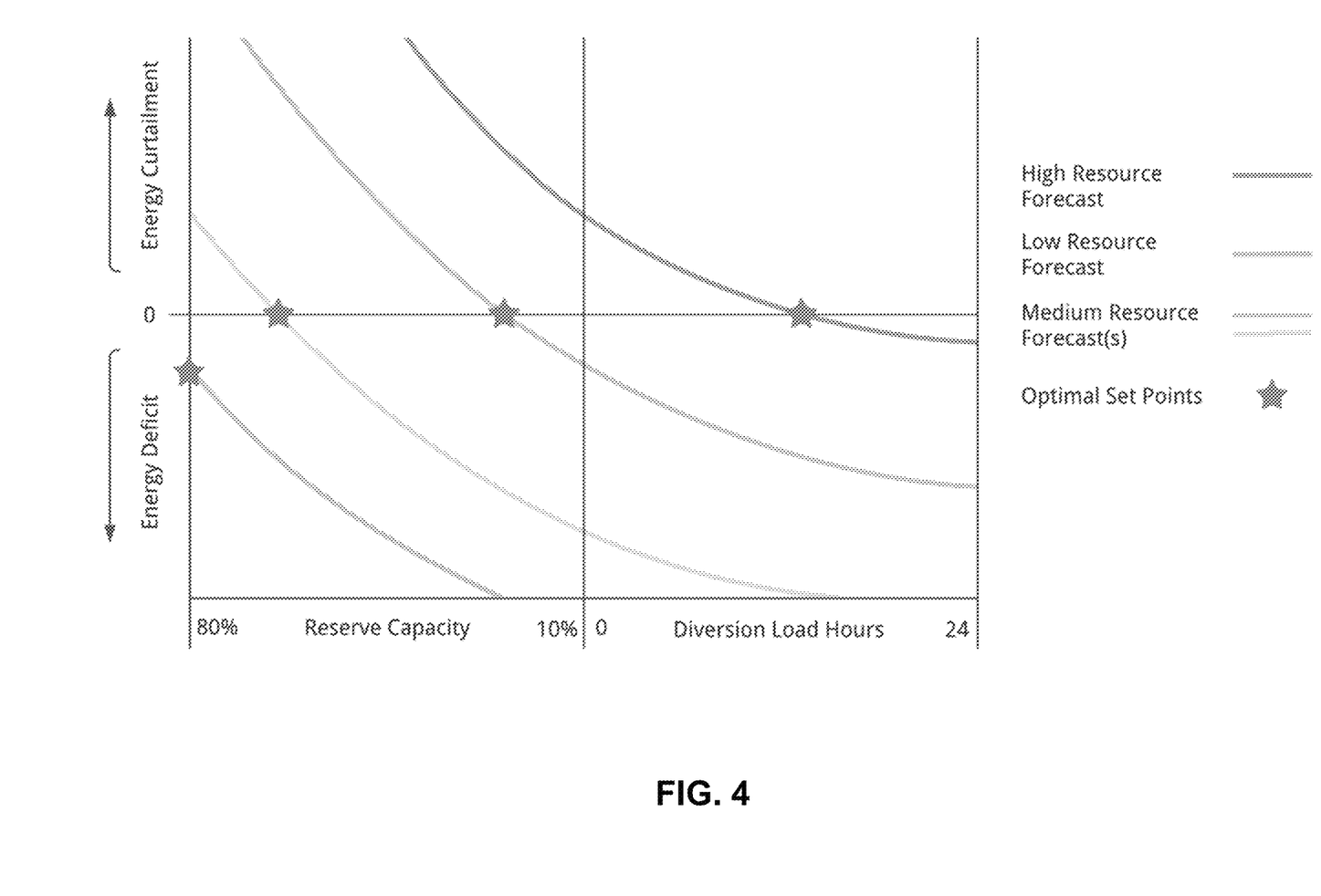
FIG. 4 is a chart illustrating an example of an optimization space for a variety of sample resource magnitudes.

In some cases, retraining of the machine learning model can occur on predefined intervals of, generally, a relatively large timescale (e.g., monthly), to account for any distinct changes in use patterns. The measured data over that training interval can be segmented into 70% training data and 30% validation data to execute the training of the model. In some cases, there may be a weighting factor employed that defines new model parameters as a weighted average of the retrained parameters, and the previous existing parameters At blocks 210 to 218, the processing unit 102 performs setpoint optimization using the load and generation predictions. FIG. 4 illustrates an example of an optimization space for a variety of sample resource magnitudes with optimal points highlighted. Note that these sample cases do not necessarily represent the magnitude of the forecasted generation resource, but rather the relative magnitude in comparison to the forecasted load.

The setpoints referred to herein are (1) a minimum state of charge threshold (which defines the point at which battery stops discharging and, in some cases, a utility assist is engaged) and (2) a diversion load schedule (which describes the magnitude of diversion load that is to be served by the microgrid). The target values can be defined by an optimization that considers the trade-off between maximizing stored energy (which increases the ability to sustain grid outages) and having sufficient available capacity to absorb any excess resource requirements, and ensure such energy is not wasted via curtailment. Since the storage capacity is finite, and too small under normal economical conditions to be able to absorb the largest possible magnitudes of excess resources, diversion load schedule or magnitude can be used to increase the utilization of the resource beyond the potential of the finite storage capacity. The optimized targets are thus the setpoints at which the utilization of the incoming resource, and the system's outage resilience potential, are simultaneously maximized.

Setpoint optimization can use a simulation-based approach, as described herein, or setpoints can be derived deterministically from the load and generation targets (for example, where computational resources are limited). In the deterministic approach, in some cases, a finite look-up table may be utilized, where the optimal minimum SoC and Diversion load hours are derived from a cumulative magnitude of predicted generation and predicted load over the prediction horizon. For example, the controller 100 may predict load and generation for a 24-hour period and sum such predictions to determine a cumulative amount of energy (in kWh, or other energy units) over the prediction horizon. The controller 100 can use the load and generation prediction values, or in some cases, the ratio of one to the other, to determine the setpoints that are generally optimal for the predicted conditions. For example, if the predictions yield 10 kWh of load, and 20 kWh of generation, the look-up table corresponding to those values, or a ratio of 2:1 generation to load, may yield optimal set-points of 30% minimum SoC and 2 hours of active diversion load centred around noon. In other cases, instead of a finite look-up table, the controller can use a linear regression or machine learning model that takes the cumulative generation and load over the prediction horizon as input to determine approximately optimal setpoints.

For the deterministic approach, both the look-up table and/or the regression model can be tuned to represent the sizing and location of a particular load centre. For example, a regression model used to determine an optimal setpoint for a load centre in Toronto, with a PV system sized 1:1 relative to annual load and a battery sized for 2 PV hours of storage, would likely differ from that of a load centre in Los Angeles, with a PV system sized 0.7:1 relative to annual load and battery sized for 1 PV hour of storage.

At block 210, the processing unit 102 simulates operation of the system 50 and a resultant energy balance throughout the prediction timeframe. The processing unit 102 can perform this simulation using a model of the system 50; the model can include, at least, the power electronics and energy storage charge and discharge dynamics. The simulation can be based on setpoints from a previous sampling window. The result of this simulation produces a first reference point on an optimization curve.

At each timestep in the prediction timeframe, the simulation can model behaviour of the system given the predicted load and generation. In a particular case, the following energy balance determination can be performed at each timestep:

A net load is determined by subtracting any effective generation from the current load on the system. Effective generation is considered to be the predicted generation multiplied by an efficiency of power conversion to serve the load (i.e., inverter efficiency). If net load remains positive, and the energy storage has available capacity to serve the load (i.e., a state of charge above the minimum setpoint) then the energy storage will discharge in proportion to the net load.

The energy storage capacity is then recalculated for the subsequent timestep by subtracting the net load, divided by the efficiency of discharge. If the energy storage does not have available capacity to serve the load (i.e., already at or below minimum setpoint) then the net load will be served by the grid source.

Alternatively, if the net load is negative, meaning that there is more effective generation than load at the current timestep, and there is available capacity in the energy storage to accept the excess generation (i.e., below 100% state of charge), then the energy storage will charge in proportion to either the net load, or its total remaining capacity (e.g., whichever is less). The energy storage capacity can then be recalculated for a subsequent timestep by adding the net load multiplied the efficiency of charge.

If there is not available capacity in the energy storage to accept the excess generation, then the excess generation is curtailed, and the total magnitude of curtailed energy is tracked in the register of the simulation.

The processing unit 102 searches for optimal setpoints defined by minimal curtailment and maximum stored energy. At block 212, the processing unit 102 modulates the minimum state of charge setpoint (also referred to as 'reserve capacity'). The processing unit 102 determines which direction to index a minimum state-of-charge (SoC) based on whether or not a current setpoint results in curtailed generation. If generation is curtailed, the setpoint is iteratively reduced at intervals of, for example, 2.5%, and performance is simulated again. This continues until either curtailment is resolved or the setpoint reaches a predetermined minimum threshold (for example, 10%). If generation is not curtailed, the setpoint is iteratively increased at intervals of, for example, 2.5%, and performance is simulated again. This continues until either curtailment is observed or the setpoint reaches a predetermined maximum threshold within a curtailment control domain (for example, 80%). In other embodiments, the modulation may follow other optimization approaches, such as gradient descent.

Curtailment generally means energy being wasted, and thus, it is desirable to avoid curtailment. In this way it is advantageous to both increase the empty space in the energy storage medium and increase load on the system until the energy available is utilized; which is indicated by curtailment being eliminated in simulation. However, having no curtailment occur in the simulation is generally not optimal because it indicates that there is too much available capacity in the storage medium; and thus, potential outage load support is sub-optimal. In such a case, the minimum SoC setpoint can be increased until just before such setpoint results in curtailment. In this way, it is most advantageous if the setpoints are defined such that the system is generally at a point right before curtailment occurs; as this represents the maximum energy than can be stored in the system without wasting future incoming energy.

In an example, if the minimum state of charge (SoC) is 40%, then a minimum of 40% of the energy storage capacity is reserved during normal operation; which can be subsequently utilized in the event of an outage condition. The minimum SoC is a control variable that defines the threshold of battery capacity at which load support switches from battery discharge to utility input.

At block 213, if the minimum SoC setpoint reaches the predetermined minimum threshold before curtailment is resolved, then at block 214, the processing unit 102 modulates a diversion load schedule and performance is simulated again. The processing unit 102 iteratively adds active diversion load hours to the schedule. Adding diversion load hours increases the total magnitude of energy that is to be supplied (i.e., outputted) by the system over the prediction timeframe; and thus, provides a mechanism to utilize additional energy that would otherwise be lost via curtailment.

For example, for a twenty-four hour schedule, adding in two hour intervals, centred around noon. This continues until either curtailment is resolved or the diversion load is fully activated (for example, on all twenty-four hours). In some cases, the predetermined minimum threshold can be based on limits of the specific energy storage used in order to avoid excessive deep discharge events that may damage and reduce the life of the energy storage (e.g., 5-10% for lithium, 50% for lead acid, 10-20% for NIMH).

At block 215, if the minimum SoC setpoint reaches the predetermined maximum threshold within the curtailment control domain, at block 216, the processing unit 102 performs a simulation of outage performance at each hour within the prediction timeframe (referred to as an outage simulation). If any outage results in lost load before a predetermined minimum outage duration threshold, the minimum SoC may be indexed further, and the outage performance is simulated again. This continues until either the minimum outage duration exceeds the minimum outage duration threshold or setpoint reaches a predetermined absolute maximum threshold (for example, 95%). The minimum outage duration threshold can be any suitable value; for example, it may be user defined, or defined with reference to the CAIDI value (consumer average interruption duration index) published by a local energy utility.

Figure 6:
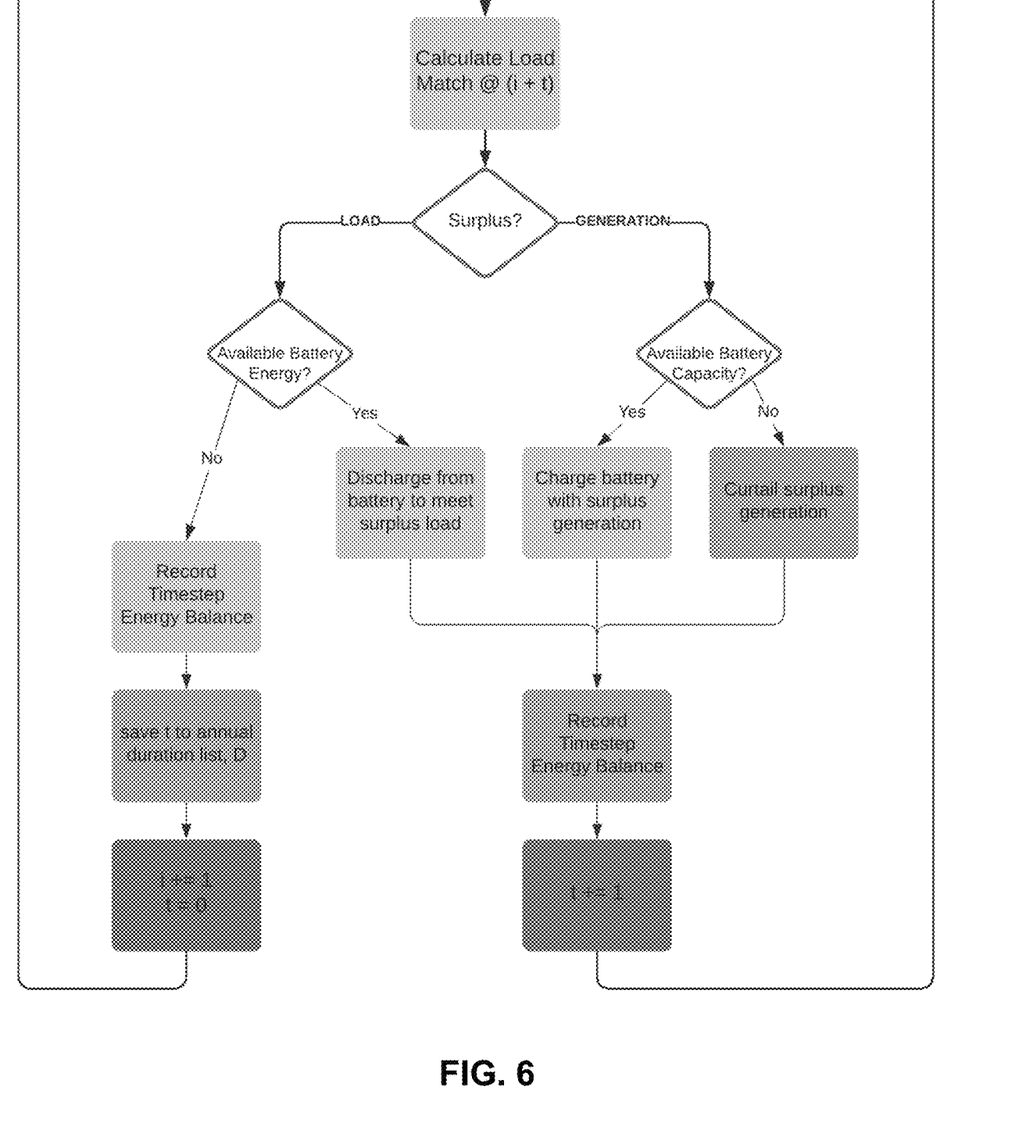
FIG. 6 illustrates a flowchart for an example of an implementation of an outage simulation, in accordance with the system of FIG. 2.

The outage simulation can generally follow the same approach as the energy balance simulation except that there is no utility source available to support the load, and the energy storage is able to discharge to its absolute minimum SoC. Each outage simulation can end when the energy storage reaches the absolute minimum, as this is the point of lost load. The duration of the simulation can be tracked and the total length of load support can be saved to an output dataset as the achieved duration of load support for an outage occurring at a given timeframe. The simulation can be performed, for example, at each hour to provide reasonable sampling of the possible outages that may occur over the prediction timeframe. Conditions generally change throughout the day, so the duration of load support for an outage happening at, for example, 6 am may be very different than an outage happening at 4 pm. FIG. 6 is a flowchart showing an example implementation of the outage simulation.

In some cases, there may be an absolute maximum SoC setpoint constraint applied to the set-point optimization in order to avoid unfavorable battery life effects, or to avoid low efficiency charging domains. In cases where the minimum outage duration is not met, this maximum SoC constraint may be overruled in the interest of outage resilience.

In some cases, the outage simulation may also consider load shedding of low priority loads in order to ensure high priority loads can be supported over a greater duration of time. This may be achieved by associating each load on the asynchronous load centre with a priority level (for example, priority 1, priority 2) and each priority level with a minimum state of charge (for example, 5%, 30%). The outage simulation can then proceed as described herein; however, after the battery state of charge drops below the minimum state of charge for a given priority level, the loads of that priority level can be turned off, and thus, no longer active in the outage simulation.

In some cases, the optimal minimum state of charge for load shedding at each priority level may also be considered in the outage simulation. For example, if the minimum outage duration cannot be met at the absolute maximum SoC (for example, 95%), then the load shedding threshold of priority 2 loads may be indexed higher, and re-simulated. This process may be iterated upon until the minimum outage duration target may be achieved for the priority 1 loads.

At block 218, the processing unit 102 outputs the optimized setpoints to the respective devices (for example, the distribution panel 32 and the controllable load diversion switches 36) for execution over a subsequent sampling window. In the subsequent sampling window, the system 50 will operate according to the optimized setpoints. Where a current state of charge happens to fall below the optimized minimum setpoint, the processing unit 102 will instruct the BESS 20 to charge from the mains 30 until the setpoint is reached. In most cases, the controller 100 can repeat the method for further sampling windows with power flow data received in such windows.

The optimized setpoints can then be communicated to various control devices in the system over a subsequent supervisory interval. For example, the controller 100 communicates with the battery energy storage system (BESS) 20 and instructs it to set the minimum state of charge, or discharge limit, to the determined optimal setpoint. In some cases, this can involve modification of the BESS holding registry though, for example, a modbus communication protocol. Similarly, the controller 100 communicates with the controllable load diversion switches 36 to instructs it to follow the determined diversion load schedule. These determined setpoints can remain active until the supervisory interval has elapsed and the controller 100 reinitiates the optimization to determine new setpoints based on updated conditions and predictions.

Figure 5:
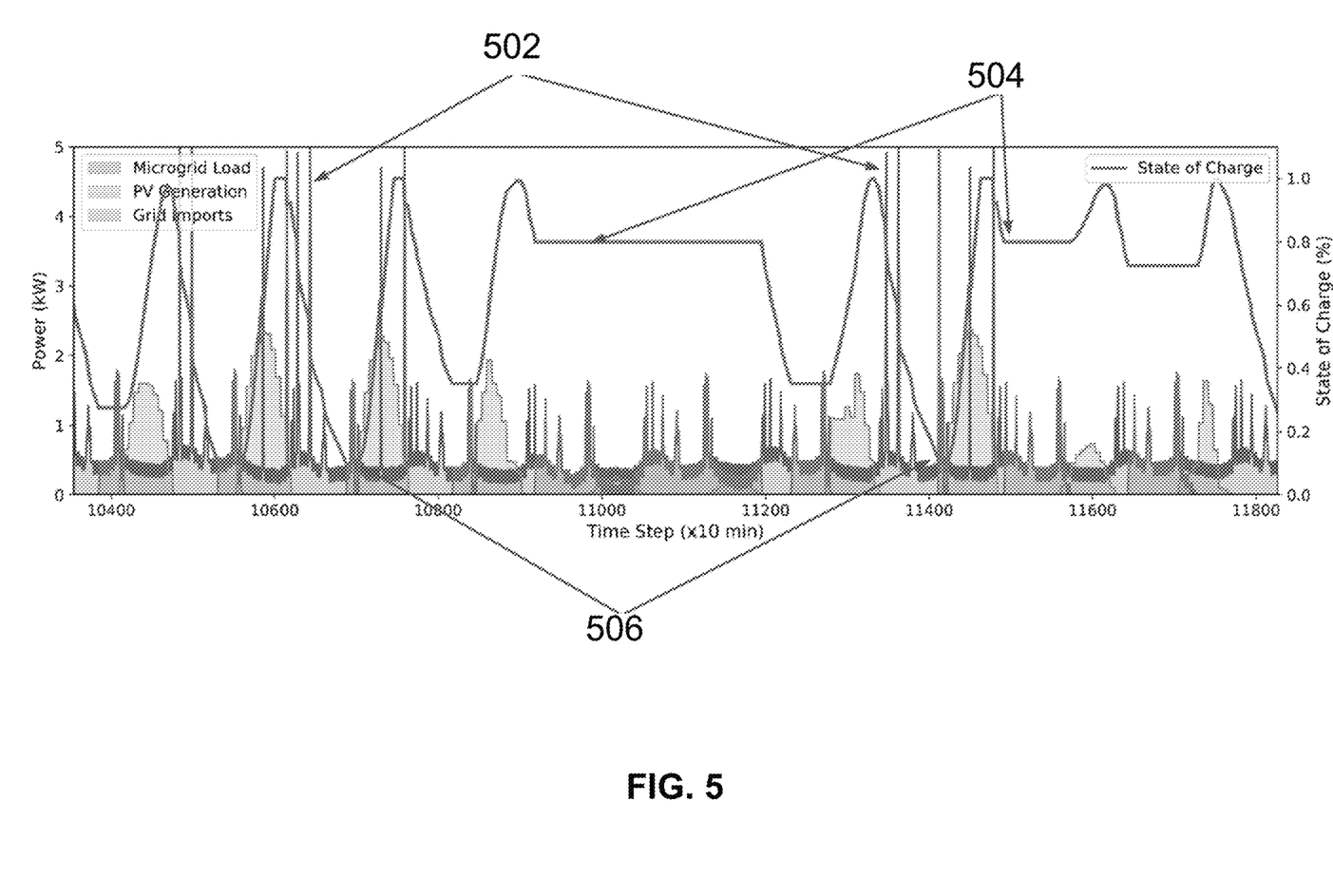
FIG. 5 illustrates results of example simulations showing time-series performance, in accordance with the system of FIG. 2.

The present inventors conducted example simulations to confirm the advantages of the present embodiments. FIG. 5 illustrates the results of the example simulations yielding the illustrated time-series performance. At 502, it can be seen that diversion load activates proportional to resource surplus in order to maximize utilization. At 504, it can be seen that reserve capacity increases proportional to resource deficiency in order to maximize potential outage resilience. At 506, it can be seen that reserve capacity reduces in advance of resource surplus in order to maximize utilization.

The present embodiments provide a number of substantial advantages, especially compared to other approaches that isolate the entire load of a building or load centre. In contrast to approaches where the entire load is isolated and the renewable generator is sized to support that entire load, the present embodiments provide load flexibility (the ability to increase load in times of excess, beyond the flexibility that may be inherent to local devices/appliances); and thus, avoid having a portion of the renewable generation curtailed (or wasted) in periods of peak production. In contrast to approaches where the entire load is isolated and the renewable generator is undersized (such that there is no excess during periods of peak generation), the present embodiments do not result in the amount of baseload grid power required to support the isolated load being overly excessive; avoiding excessive losses due to the double conversion of utility power across the DC link. Thus, the load segmentation of the present embodiments enables maximum resource utilization with minimal utility conversion losses.

Also advantageously, the load flexibility that is provided by the present embodiments enables the elimination of resource curtailment on an annual basis in seasonal climates with an economical and/or resource efficient amount of paired energy storage. Significantly, the result of lack of curtailment enables economic performance that is generally on par with that of grid interactive, exporting energy assets; which is generally not feasible with other approaches.

While the present disclosure may refer to renewable power generation sources of solar photovoltaics and wind turbines, it is understood that any source can be used; for example, micro hydro turbines, and the like.

While the operating environment 52 and the system 50 are illustrated and described as having a certain arrangement of aspects and features, it is understood that any suitable arrangement can be used that retains the functions described with respect to the present embodiments.

Although the foregoing has been described with reference to certain specific embodiments, various modifications thereto will be apparent to those skilled in the art without departing from the spirit and scope of the invention as outlined in the appended claims. The entire disclosures of all references recited above are incorporated herein by reference.

The invention claimed is:

1. A method for predictive energy management for a segmented load centre connected to a mains power supply, the segmented load centre having an energy storage system and renewable energy sources, the method executable on a controller or executed as a model on a computing device, the method comprising:

receiving power flow data from the segmented load centre;

determining a load prediction for a predetermined prediction timeframe, the load prediction using a machine learning model taking load conditions of the power flow data as input features, the machine learning model trained using historical load conditions;

determining a generation prediction for the predetermined prediction timeframe using a renewable generation model representative of the renewable energy sources of the segmented load centre, the generation prediction using input features comprising weather data related to the generation of renewable power by the renewable energy sources of the segmented load centre;

determining an energy balance over the prediction timeframe using the load prediction and the generation prediction in an operation simulation of the segmented load centre;

modulating a minimum state of charge setpoint based on whether a current value of the setpoint results in curtailed generation in the determined energy balance over the prediction timeframe; and controlling the segmented load centre based on the minimum state of charge setpoint over a future time period, wherein if a state of charge of the energy storage system falls below the minimum state of charge during said future time period, the energy storage system is charged from the mains power supply until the minimum state of charge is reached.

2. The method of claim 1, wherein modulating the minimum state of charge setpoint comprises iterating the modulation until an end condition is reached.

3. The method of claim 2, further comprising, where the minimum state of charge setpoint reaches a predetermined minimum threshold before the end condition, modulating a diversion load schedule, repeating the operation simulation of the load centre, and outputting the diversion load schedule.

4. The method of claim 2, further comprising, where the minimum state of charge setpoint reaches a predetermined maximum threshold, iteratively performing a simulation of outage performance for time periods within the prediction timeframe.

5. The method of claim 2, further comprising, where an outage results in lost load before a predetermined minimum outage duration threshold, increasing the minimum state of charge setpoint and repeating the simulation of outage performance until an outage end condition is reached.

6. The method of claim 1, wherein the weather data related to the generation of renewable power comprises time series forecast for one or more of dry bulb temperature, global horizontal irradiation, direct normal irradiation, wind speed, wind direction, and precipitation.

7. The method of claim 1, wherein the renewable generation model further takes as input installation features or internal system features of a photovoltaic array or a wind turbine array defining one of the renewable energy sources of the segmented load centre.

8. The method of claim 1, wherein the load prediction comprises predictions for asynchronous load over the prediction timeframe and diversion load over the prediction timeframe.

9. The method of claim 1, wherein the load conditions comprise loads during certain weather conditions, and loads during certain times of the day, days of the week, or times of the year.

10. The method of claim 1, wherein the operation simulation comprises:
determining a net load by subtracting effective generation from a current load; and
determining energy storage capacity by:
where the net load is positive, subtracting the determined net load from the energy storage capacity; or
where the net load is negative, charging the energy storage in proportion to the net load or a total remaining capacity the energy storage.

11. A controller for predictive energy management for a segmented load centre connected to a mains power supply, the segmented load centre having an energy storage system and renewable energy sources, the controller comprising one or more processing units in communication with a memory unit comprising executable instructions to:
receive power flow data from the segmented load centre;
determine a load prediction for a predetermined prediction timeframe, the load prediction using a machine learning model taking load conditions of the power flow data as input features, the machine learning model trained using historical load conditions;
determine a generation prediction for the predetermined prediction timeframe using a renewable generation model representative of the renewable energy sources of the segmented load centre, the generation prediction using input features comprising weather data related to the generation of renewable power by the renewable energy sources of the segmented load centre;
determine an energy balance over the prediction timeframe using the load prediction and the generation prediction in an operation simulation of the segmented load centre;
modulate a minimum state of charge setpoint based on whether a current value of the setpoint results in curtailed generation in the determined energy balance over the prediction timeframe; and
control the segmented load centre based on the minimum state of charge setpoint over a future time period, wherein if a state of charge of the energy storage system falls below the minimum state of charge during said future time period, the energy storage system is charged from the mains power supply until the minimum state of charge is reached.

12. The controller of claim 11, wherein modulating the minimum state of charge setpoint comprises iterating the modulation until an end condition is reached.

13. The controller of claim 12, where the minimum state of charge setpoint reaches a predetermined minimum threshold before the end condition, the controller further modulates a diversion load schedule, repeating the operation simulation of the load centre, and outputting the diversion load schedule.

14. The controller of claim 12, where the minimum state of charge setpoint reaches a predetermined maximum threshold, the controller further iteratively performs a simulation of outage performance for time periods within the prediction timeframe.

15. The controller of claim 12, where an outage results in lost load before a predetermined minimum outage duration threshold, the controller increases the minimum state of charge setpoint and repeating the simulation of outage performance until an outage end condition is reached.

16. The controller of claim 11, wherein the weather data related to the generation of renewable power comprises time series forecast for one or more of dry bulb temperature, global horizontal irradiation, direct normal irradiation, wind speed, wind direction, and precipitation.

17. The controller of claim 11, wherein the renewable generation model further takes as input installation features or internal system features of a photovoltaic array or a wind turbine array defining one of the renewable energy sources of the segmented load centre.

18. The controller of claim 11, wherein the load prediction comprises predictions for asynchronous load over the prediction timeframe and diversion load over the prediction timeframe.

19. The controller of claim 11, wherein the load conditions comprise loads during certain weather conditions, and loads during certain times of the day, days of the week, or times of the year.

20. The controller of claim 11, wherein the operation simulation comprises:
determining a net load by subtracting effective generation from a current load; and
determining energy storage capacity by:
where the net load is positive, subtracting the determined net load from the energy storage capacity; or
where the net load is negative, charging the energy storage in proportion to the net load or a total remaining capacity the energy storage.

21. A system for predictive energy management for a segmented load centre, the system comprising the controller of claim 11 in communication with one or more relays, an inverter, a distribution panel, a battery energy storage system, and one or more converters or rectifiers.

* * * * *